United States Patent [19]

Lewis et al.

[11] 3,820,993

[45] June 28, 1974

[54] LIGHT SENSITIVE REPRODUCTION AND ELECTRON BEAM SENSITIVE MATERIAL

[75] Inventors: James M. Lewis, Aurora; Eugene Wainer, Shaker Heights, both of Ohio

[73] Assignee: Horizons Incorporated, a Division of Horizons Research Incorporated, Cleveland, Ohio

[22] Filed: June 19, 1973

[21] Appl. No.: 371,431

Related U.S. Application Data

[62] Division of Ser. No. 141,393, May 7, 1971, Pat. No. 3,769,023.

[52] U.S. Cl. .......................... 96/35.1, 96/33, 96/36, 96/36.2, 96/36.3, 96/115 P, 204/159.15, 204/159.23

[51] Int. Cl. .............................................. G03c 5/00

[58] Field of Search .............. 96/35.1, 33, 36, 36.2, 96/36.3, 115 P, 115 R

[56] References Cited

UNITED STATES PATENTS

| | | | |
|---|---|---|---|
| 3,042,516 | 7/1962 | Wainer | 96/48 |
| 3,121,632 | 1/1964 | Sprague et al. | 96/48 |
| 3,275,443 | 9/1966 | Wainer | 96/90 |
| 3,330,659 | 7/1967 | Wainer | 96/115 R |
| 3,374,094 | 3/1968 | Wainer | 96/33 |
| 3,406,067 | 10/1968 | Cerwonka | 96/115 P |
| 3,436,215 | 4/1969 | Levinos et al. | 96/115 P |
| 3,563,749 | 2/1971 | Munper et al. | 96/90 |
| 3,600,173 | 8/1971 | Levinos | 96/115 P |
| 3,615,452 | 10/1971 | Cerwonka | 96/115 P |
| 3,620,734 | 11/1971 | Cerowonka | 96/115 P |

*Primary Examiner*—Ronald H. Smith
*Assistant Examiner*—Edward C. Kimlin
*Attorney, Agent, or Firm*—Lawrence I. Field

[57] ABSTRACT

Light sensitive reproduction and electron beam sensitive material useful in preparing positive and/or negative copies, planographic and deep etched lithographic plates, deep etched printing plates, thin and thick film printed circuits, circuits for microelectronics, and chemical milling of metals, plastics and glass, is formed by coating a suitable support with a composition which includes (1) a hydroxy alkyl cellulose; (2) an ethenically unsaturated vinyl monomer including N-vinyl monomers; (3) at least one compound which produces free-radicals on exposure to light; (4) color formers taken from the general class of intermediates which produce color on exposure to condensation agents, oxidizing agents, and/or acids; (5) organic sulphur compounds for the promotion of adhesion; and (6) agents for improving the shelf stability of the product either in dissolved form or in the form of a solvent-free layer on a suitable surface taken from the class of cresols, phenols and triaryl compounds of the A sub group of metals taken from the 5th column of the Periodic Table. The composition may or may not contain other compounds which promote polymerization and/or crosslinking on exposure to light. The composition is dry working and is placed into solution for coating purposes only in organic solvents. After exposure and suitable development, the non-image areas may be removed by washing in water which has no effect on the areas which are exposed to light or electron beams. The exposed areas are colored and are hydrophobic in nature, readily accepting ink so as to make the end result suitable for lithographic and printing purposes. The composition has the further feature that while the non-image areas are soluble in cold water the image areas after exposure, development and washing in cold water may be removed readily for circuit purposes by washing in hot deionized water or in certain cases by a mixture of water and acetone. The composition is characterized by exceptionally high resolution, and though originally sensitive primarily to the ultraviolet and to electron beams can be sensitized to the visible through the panchromatic range by the addition of suitable color sensitizers. Certain aspects of the composition may be operated positively or negatively. The composition is further characterized that under suitable conditions it will print-out in any one of a variety of prechosen colors, if desired. The composition may be utilized for imaging and/or resist purposes as desired.

7 Claims, No Drawings

LIGHT SENSITIVE REPRODUCTION AND ELECTRON BEAM SENSITIVE MATERIAL

This application is a division of application Ser. No. 141,393, filed May 7, 1971, and now U.S. Pat. No. 3,769,023.

BACKGROUND OF THE DISCLOSURE

U.S. Pat. No. 3,042,517 describes a dry working composition based on a combination of vinyl monomers taken from the class of N-vinyl compounds, organic halogen compounds, and aryl amines dissolved in an organic binder which, when exposed to light, and suitably dry processed will produce a color. U.S. Pat. No. 3,042,519 and U.S. Pat. No. 3.046,125 describe a similar organic soluble composition which may be utilized as photoresists which produce a color on processing and which is made available for photoresist purposes by treatment with an organic solvent. A large number of issued United States Patents define compositions containing sources of free-radicals which produce color on exposure to light either directly or as a consequence of heating or a combination of optical development and heating. In general, the source of the color is a complex substituted amine, coupled with an activator or initiator. These complex amines are described in a host of U.S. Pat., Nos. such as 3,510,304; 3,486,898; 3,042,515; 3,042,517; 3,046,125; 3,046,209, 3,056,673; 3,164,467; 3,095,303; 3,100,703; 3,102,810; 3,342,603; 3,102,029; 3,106,466; 3,109,736; 3,272,635; 3,284,205; 3,342,595; 3,377,167; 3,285,744; and, 3,342,602. A special class of amines combined with other agents operate as color couplers in the presence of these activators and these are described in U.S. Pat. No. 3,533,792 and U.S. Pat. No. 3,539,346. These color coupling systems usually operate through the medium of specific classes of activators taken from the class of complex amines of the bisdiamino class, coupled with such compounds as pyrazoles, pyrazolones, mercapto and thiol compounds, acetanilides and substituted acetanilides, and phenols. Activators which enable these color forming reactions to take place on exposure to light and/or electron beams are described in U.S. Pat. Nos. 3,042,515; 3,121,632; 3,121,633; 3,113,024; 3,284,205; 3,140,948; 3,140,949; 3,272,635; 3,445,232; 3,285,744; 3,342,595; 3,342,602; 3,342,603; 3,342,604; and, 3,359,105.

Compositions involving ethylenically unsaturated monomers taken from the N-vinyl compound class and organic halogen compounds which produce free-radicals on exposure to light and electron beams are described as both light sensitive and electron beam sensitive materials in U.S. Pat. No. 3,147,117.

Compositions involving organic halogen compounds and N-vinyl compounds as the base system and which contain materials taken from the class of aryl compounds of certain metals for the prevention of thermal fog on processing and on storage are described in U.S. Pat. No. 3,275,443. Compositions useful for photoresist purposes and comprising various mixtures of ethylenically unsaturated monomers, crosslinking agents and the like and useful for the manufacture of lithographic plates and printed circuits and including the use of crosslinking agents are described in U.S. Pat. No. 3,330,659. Compositions describing a combination of N-vinyl compounds, free-radical initiators, and various binding agents are described in U.S. Pat. No. 3,374,094. This reference is significant for the purpose of this application in that in order to produce the hydrophilic-hydrophobic requirements for yielding a planographic-lithographic type printing plate, water emulsions of specific ingredients may be utilized or the need for emulsion technology may be eliminated as defined in Column 6 of the referenced patent.

U.S. Pat. No. 3,443,945 further describes the capability for a combination of N-vinyl compounds and certain organic amines to produce color on exposure to light and suitable processing, this description being classified as an extension of U.S. Pat. No. 3,042,517. U.S. Pat. No. 3,486,898 further describes the color forming characteristics of combinations of N-vinyl compounds and aryl and/or heterocyclic amines in the presence of the free-radical initiator.

U.S. Pat. No. 3,525,616 describes a combination of a N-vinylcarbazole, (a member of the class of N-vinyl compounds), a light sensitive halogen hydrocarbon source of free-radical, and a leuco triaryl methane dye. This composition is normally developed for resist purposes by washing in an organic solvent.

U.S. Pat. No. 3,563,749 describes a combination of N-vinyl compounds, dyes of the merocyanine class and a halogenated hydrocarbon with a suitable polymeric binder which is dissolved in an organic solvent. After exposure to light and suitable processing, the plate is then developed by wiping with cold water. The principal application defined in this patent is for printing purposes involving such bases as paper, aluminum, copper, zinc, magnesium, and certain plastic foils. It is significant to note that the only solvents specifically described in U.S. Pat. No. 3,563,749 are petroleum either and acetone.

The disclosures of each of the prior art patents noted above are intended to be incorporated herein by reference.

It is seen that a relatively huge volume of patent literature exists dealing with the color and/or resist reactions which develop when combinations of certain complex organic amines and halogenated hydrocarbons in a suitable binder are exposed to light and thereafter processed.

The ideal photoresist composition for use in a variety of fields, such as lithography, letterpress printing, manufacture of printed circuits, preparation of microelectronic circuits, chemical milling and other photomechanical applications must exhibit an extremely wide range of chemical, physical and mechanical properties in order to make the ideal composition useful to its fullest extent in all of these applications. None of the above noted references define materials which produce a light and/or electron beam result when exposed to this type of radiation exhibit this combination of ideal properties. Nor does any normal combination of this vast art exhibit this combination of ideal properties.

In order not only to define the deficiencies of the prior art and to establish the novelty of the present invention, a partial list of some of these ideal properties will be given.

Among the most desirable properties for an all-purpose photoresist are the following:

1. On exposure to light, it should have a speed sufficient so as to make it useful for projection printing. This means that the photographic speed for full exposure should be in the range of 25 millijoules, or less.

When color formers are present, photographic speed is designated as the number of millijoules required to yield a density of 1.0 units above base plus fog.

2. For contact printing, and to ensure the maintenance of the highest resolution possible, the photographic speed should be capable of being slowed down and should be in the range of 50 to 150 millijoules.

3. The spectral sensitivity of the resist should be controllable. Not only is spectral sensitivity to the panchromatic visible desirable, but also the composition should be capable of modification so that it exhibits no sensitivity whatsoever to the visible and is sensitive only in the ultraviolet range available from inexpensive light sources.

4. No matter what the spectral sensitivity to light, the material should exhibit electron beam sensitivity.

5. The same composition should be capable of exhibiting both positive and negative working characteristics.

6. Prior to development with any reagent whether water borne or not, the image produced by light and/or electron beams should be easily visible so that the exposed layer, developed without the use of solvent, is permanent, fully fixed, and showing sufficient color differential so that itis entirely suitable for image reproduction purposes only, if desired.

7. The photoresist composition in solution form, in dried form placed on a chosen base or substrate, or in free dried film form should have adequate shelf life for commercial utility; and such adequate shelf life is designated as bieng at least 6 months or longer, at room temperature, without significant loss of photosensitive, chemical and physical properties.

8. The material should be capable of being applied to substantially any kind of surface, including metals, alloys, plastics, papers, wood, cloth and the like without deterioration of its properties and shelf stable characteristics.

9. The material should be capable of being made available in free film form, i.e., without any support provided by a substrate.

10. Irrespective of the nature of the support on which the material is placed, the material should be capable, after exposure and development, of adhering strongly to such support and maintaining such adherence through subsequent operation, particularly exposure to highly corrosive chemical agents.

11. When placed in solution form (organic solvent) needed to make it applicable to the various surfaces described, the material should be completely soluble in a wide variety of organic solvents so that all of the reagents needed to achieve the ideal characteristics are made available for the full purposes of the photoresist. Such solvents may be alcohols, glycols, cellosolves, chlorinated solvents, hydrocarbons, amine type solvents, ethers, ketones, esters, and combinations thereof.

12. The resist whether exposed or unexposed should be insoluble in a variety of organic reagents, such as high molecular weight aliphatic hydrocarbons, glycerine, trichloroethylene, kerosene, mineral oils, and vegetable oils, these being normal components of lithographic and printing inks.

13. Ideally, after exposure and development, the nonimage areas should be easily soluble in cold to warm pure water and the developedout and processed image areas soluble in hot pure water.

14. No matter how comprised, developed and/or fixed, the resist on the image areas after water development should not only be soluble in hot pure water but easily soluble in cold ketones and alcohols which have a tolerance for water, such as acetone, methyl alcohol, and ethyl alcohol. Again, ideally, higher boiling point solvents should be capable of stripping the image by vapor degreasing techniques. Such materials may be taken from the class of isopropyl alcohol, the cellosolves, dimethylformamide, tertiary butanol, butyl acetate, and the like. Removal is necessary after a printed circuit has been produced in order to expose it for a subsequent operation, such as soldering connections.

15. The image should be insoluble in hct or cold water containing as little as 0.5 percent dissolved alkali, acid and/or neutral salts of any description.

16. The exposed, developed, and fixed-out image areas containing a covering of finished and processed photoresist should be capable of withstanding the action of hot aqueous solutions whether dilute of concentrated of substantially any description. Such hot aqueous solution may contain strong alkalis, such as sodium hydroxide, or potassium hydroxide, strong acids, such as hydrochloric, nitric, sulphuric, chromic, phosphoric, hydrofluoric, and the like and mixtures thereof, strong acid salts, such as ferric chloride, cupric chloride, acid fluorides, aqua regia, ferricyanide-hydroxide mixtures, and the like. In summary, the exposed and developed-out resist must withstand an extremely wide range of either acid or alkali contact in concentrated form for periods of time extending in some cases to an excess of 2 hours without notable attack on the resist areas, thus extending and ensuring the possibilities for deep etching and thruput chemical milling.

While the foregoing list does not cover all of the ideal characteristics of the photoresist for the various applications which have been listed, the prior art patent evidence which has been listed has been sufficiently defined so as to show that none of the patents cited describe compositions which are capable of fulfilling all of these objectives, nor is any combination thereof capable of fulfilling all of these objectives. The compositions of this invention achieve the ideal conditions indicated in the foregoing list and others which are also of value for the consumer.

SUMMARY OF THE INVENTION

A. The Materials

1. The Resinous Binders

The resinous binders utilized in the compositions of the present invention are hydroxy alkyl celluloses. The propyl derivative is preferred. The molecular weight range of the hydroxy propyl cellulose useful for the purpose of this invention includes molecular weights from 25,000 up to 900,000. Other suitable hydroxy alkyl celluloses are hydroxy methyl, hydroxy ethyl, and hydroxy butyl celluloses, of molecular weights in the same range as the propyl derivative. For negative working systems, the preferred range of molecular weights is between 25,000 and 75,000 and for positive working systems of a particular type to be described later, the preferred molecular weight range is between 150,000 and 900,000. In pure form, this material is somewhat hygroscopic and tends to absorb moisture from the atmosphere. Such moisture absorption causes the material to cake and produce large, hard lumps which are difficult to dissolve. This tendency for caking may be eliminated by adding up to 5 percent of colloidal silica or colloidal alumina, neither of which interferes with the working and the resist properties of the material after it is properly processed. In pure form, hydroxy propyl cellulose exhibits an extraordinarily wide range of solubility in a variety of solvents. These solvents include water, alcohols, cellosolves, chloroform, morpholine, dioxanes, tetrahydrofuran, ketones, mixtures of hydrocarbons and alcohols, esters, methylene chloride, and the like. The materials are insoluble in aliphatic hydrocarbons, aromatic hydrocarbons without the presence of alcohol, mineral oils, kerosene and vegetable oils. While the material is soluble in water, the presence of acids, alkalis, salts or glycerine reduce or eliminate such water solubility in some cases completely.

2. The Ethylenically Unsaturated Compound

At least one ethylenically unsaturated monomer capable of polymerization is a required component of the composition. These monomers include N-vinyl compounds and are listed in Tables 1 and 2 following:

TABLE 1

SUITABLE POLYMERIZABLE N-VINYL COMPOUNDS

A. N-VINYL AMINES (HETEROCYCLIC AND ARYL)

1. N-vinyl indole
2. N-vinyl carbazole
3. N-vinyl phenyl-alpha-naphthylamine
4. N-vinyl pyrolle
5. N-vinyl diphenylamine (stabilized with 0.1 percent cyclohexylamine)
6. 3,6-dimethyl-N-vinyl carbazole
7. 3-(2 hydroxy-1-naphthylazo)-9-vinyl carbazole
8. 3-(9′ xanthyl)-9-vinyl carbazole
9. 9-vinyl-(2′3′:3,4)-napthocarbazole
10. 9-vinyl-3-(p-hydroxyanilino)-carbazole
11. 3-indole-phenol-9-vinyl carbazole
12. 3-indole-phenol azo-9-vinyl carbazole

B. N-VINYL AMIDES AND IMIDES - U.S. PATENT NO. 3,042,517

1. N-vinyl succinimide
2. N-vinyl phthalimide
3. N-vinyl pyrollidone
4. N-vinyl-N-phenylacetamide
5. N-vinyl-N-methylacetamide
6. N-vinyl diglcolylimide
7. N-vinyl imidazole

TABLE 2

(VINYL MONOMERS (ETHYLENICALLY UNSATURATED) USEFUL AS SUBSTITUTES IN WHOLE OR IN PART (PREFERABLY IN PART) FOR THE N-VINYL COMPOUNDS OF TABLE 1)

(USEFUL ETHYLENICALLY UNSATURATED COMPOUNDS (WHEN USED ADD BENZOIN OR CONGENER AS DEFINED IN TABLE 4)

1. Styrene
2. 50 styrene - 50 maleic anhydride
3. p-cyanostyrene
*4. vinyl naphthalene
5. 9-methylene fluorene
6. methyl methacrylate
7. methyl acrylate
8. acrylonitrile
*9. acrylamide
*10. methylacrylamide
*11. N,N diphenylacrylamide
12. vinyl acetate
13. 50 vinyl acetate - 50 maleic anhydride
14. ethyl methacrylate
15. ethyl acrylate
16. butyl methacrylate
*17. methylacrylanilide
*18. N,N′ diphenylmethylacrylamide
*19. N-phenyl acrylamide
20. methyl vinyl ketone
*21. N-N′ methylene bisacrylamide The various classes of monomers require different methods of processing depending on their nature. In summary, the N-vinyl amines listed in Table 1 (A) may be utilized readily and easily in air and without the need for adding special crosslinking agents and under these conditions operate at the highest photographic speed. The N-vinyl compounds listed in Table 1 (B) show equivalent speed providing the initial exposure to light and/or electron beams is made in the absence of oxygen. This is accomplished readily either by making the exposure in a vacuum frame, or by treating the surface with an atmostphere of flowing nitrogen or argon for at least 30 seconds prior to exposure.

The monomers listed in Table 2, when part of the base composition, operate best in the absence of oxygen and again through the techniques defined in previous sentences. It is noted that some of the monomers in Table 2 are liquids at room temperature and as such become part of the solvent system. The liquid type of monomers are normally retained in the fully deposited system in dry film form provided the system is not heated unduly prior to exposure and in many cases this is accomplished simply by permitting the wet photoresist solution to dry at room temperature. Because of the complications involved in using such liquid monomers, the solid varieties are preferred and these are marked with a star in Table 2.

The monomers listed in Table 2 may be used as complete substitutes for the N-vinyl compounds shown in Table 1. However, certain precautions need to be taken in connection with their use, particularly if the substitution for the items in Table 1 is a complete one. These monomers are most effective in an oxygen-free atmosphere, particularly with regard to photographic speed. The use of these monomers in an oxygen containing atmosphere slows down the photographic speed drastically by virtue of the presence of an induction period. In addition, while they can be used alone, without special hardeners, their activity is much improved by the deliberate addition of small percentages of crosslinking agents in the range of 0.5 to 3 percent of the amount of the monomer of the type listed in Table 2. The crosslinking agents which are most effective for this purpose are listed in Table 3. In addition to the foregoing, and again particularly when the ethylenically unsaturated compound added to the composition is comprised solely of materials taken from Table 2, the desired photochemical reaction is accelerated and made more efficient by the addition of an acyloin as defined in Table 4.

TABLE 3

CROSSLINKING AGENTS

U.S. PAT. NO. 3,330,659

1. Glyceryl trimethacrylate
2. Diethyl maleate
3. Allyl anthranilate
4. Neopentylglycoldimethacrylate
5. N,N'-hexamethylenebisacrylamide
6. N,N'-methylenebisacrylamide
7. Ethylene dimethacrylate
8. N,N'-diallyl aniline

TABLE 4

ACYLOINS USEFUL AS INITIATOR PROMOTERS WHEN COMPONENTS IN TABLE 2 ARE USED (U.S. PATENT NO. 3,330,659)

1. Benzoin
2. 2-methyl benzoin
3. 2-allyl benzoin
4. 2-phenyl benzoin
5. Tertiary-butyl benzoin
6. Toluoin
7. Acetoin
8. Butyroin
9. 3-hydroxy-4-methyl pentanone - 2
10. 11-hydroxy-12-ketotetracosane
11. Glycolic aldehyde Above intiator promoters are taken from the class of hydroxy ketones known as acyloins or keto alcohols represented by the general formula:

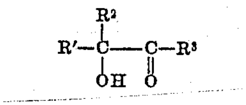

where R' and $R^3$ are each an alkyl or aryl substituent and $R^2$ is H, alkyl or aryl, it being preferred that $R^3$ be aryl.

3. THE COLOR FORMERS

A feature of the invention is the capability for producing a color directly on exposure to light leaving the non-exposed areas essentially colorless. This type of action is specially useful in step and repeat printing and in printed circuits where the line width is extremely small. Defects in reproduction can be seen at this stage of the operation since the majority of the time consuming and expensive operation takes place subsequent to the exposure step. A further feature of this color forming reaction is that the color formers suitable for the purpose of this invention are essentially colorless to begin with and exhibit relatively low absorption in the wavelength at which the photoresist is most active from the standpoint of producing insolubility as a consequence of exposure to light. As a consequence the light can pass through to the back of the resist, thereby accentuating the adhesion promoting properties of the combination to a suitably prepared base and thus color develops throughout the composition from the base outwards. The development of the color, in most cases, adds to the desired insolubility characteristics of the composition in view of the chemistry of the color formation, thereby facilitating subsequent processing.

The N-vinyl amines of Table 1 (A) are color formers in their own right. However, the range of colors available is somewhat limited and thus small amounts of separate color formers are generally added deliberately to extend the desired range.

The color formers are those types of compounds which yield color by possibly four different reactions and combinations thereof. These reactions are condensation (in the case of such compounds as diphenylamine or indole), acidification in the case of such compounds as carbinols and dye bases, oxidation plus acidification in the case of such compounds as the leuco triphenylmethanes, leuco xanthenes, and analogs thereof, color coupling reactions as in the case of diamines in the presence of pyrazoles, pyrazolones, anilides, and mercapto and thiol containing compounds. In all of these cases, the reaction to produce a color from a dye intermediate, a leuco compound or a dye base must be coupled with the simultaneous formation of acid so as to produce the acid salt. The generic classes of color formers which yield these desired reactions are given in Tables 5 and 5 (A). These color formers may be used alone to produce a specific color or in mixture to produce effectively any desired color. The colors range from pale yellows to blacks with every color in the spectrum effectively being capable of being produced as desired.

TABLE 5

| GENERIC CLASSES OF COLOR FORMERS (DIRECT) | |
|---|---|
| 1. Leuco triphenyl methanes | |
| Leuco triphenyl methane carbinols | |
| Triphenyl and diphenyl methane dye bases | |
| Leuco diphenyl methanes | |
| Diphenylamine and N-alkyl, aryl, heterocyclic substitutes | |
| Phenylene-diamines and N substituted derivatives | |
| Indole, 3-methyl skatole, carbazole | and N-alkyl, N-aryl and N-heterocyclic substitutes |
| See: U.S. Pat. Nos. | 3,510,304; 3,486,898; 3,042,515; 3,046,125 |
| Carbazoles and Indoles | 3,046,209; 3,056,673; 3,164,467; 3,486,898 |
| 2. Styryl dye bases and vinylene homologues; U.S. Pat. No. 3,095,303 | |
| 3. Cyanine dye bases; U.S. Pat. Nos. | 3,100,703; 3,342,603; 3,102,810 |
| 4. Carbinol bases; U.S. Pat. No. 3,102,029 | |
| 5. Merocyanines and merocyanine dye bases; U.S. Pat. Nos. 3,106,466 and 3,109,736 | |
| 6. Leuco xanthenes, Leuco thioxanthenes, Leuco selenoxanthenes, Leuco acridenes, Leuco dihydroanthracenes | U.S. Pat. No. 3,272,635; do. 3,284,205; do. 3,342,595; do. 3,377,167; do. 3,285,744; do. 3,342,602 |
| 7. Xanthhydrol | |
| 8. Michler's hydrol | |
| 9. Rubrene (sensitizer) | |
| 10. Rhodamine B Base | |

TABLE 5 (A)

GENERIC CLASSES OF COLOR FORMERS (COLOR COUPLING TYPE)

SEE: U.S. Patent Nos. 3,533,792 and 3,539,346

A. BASE COLOR FORMER

Diphenylmethanes and substituted diphenylmethanes

Diphenylamines and substituted diphenylamines and more particularly, 1, 1-bis(p-dimethylaminophenyl-)ethylene and/or diphenylamine, indole, substituted analines, and phenylenediamines.

B. COLOR MODIFIERS (COUPLERS)

1. 4-amino 3,5 substituted pyrazole
2. 3,5 and 1,3,5 pyrazolones
3. bis-pyrazolones
4. mercapto and thiol compounds containing a SH group
5. acetanilides and substituted acetanilides

4. THE ACTIVATORS

In order for both the color forming reaction and the desired complete photopolymerization to take place, the system must contain an activator. In general, these activators may be described as agents which produce free-radicals on exposure to light, such free-radicals not only being capable of initiating a high degree of polymerization in the polymeric system but at the same time being capable of producing color from the color formers listed in Table 5.

The acyloins described in Table 5 are activators for the photopolymerization alone and if color is desired activators of the type listed in Table 6 must be used. It is noted that the activators in Table 6 are divided into three generic classes. Class 1 are organic halogen compounds and these are the preferred reagents. Class 2 normally do not contain halogen or sulphur and are taken from the class of the phenones, carbonyl containing compounds, triazoles, and imides. Class 3 are sulphur containing organic compounds. While each class may be used separately, generally the best results are obtained, particularly when response in the visible is desired by employing mixtures of Class 1 and a component taken from one of the other two classes, and particularly from Class 3. Thus, an ideal combination for most purposes is a mixture of iodoform and mercaptobenzothiazole.

After exposure, usually the activity of these activators may be destroyed completely either by heating to a temperature at which the activator volatilizes completely from the system or as a consequence of the reagents remaining in the system which are oxidized to an inactive form. This oxidation is particularly notable when mixtures of Class 1

TABLE 6

ACTIVATORS

| | |
|---|---|
| (1) ORGANIC HALOGEN TYPE - U.S. PATENT NO. 3,042,515 | |
| $CHI_3$ (iodoform) | |
| $CBr_4$ (carbon tetrabromide) | |
| $CI_4$ (carbon tetraiodide) | |
| Hexachlorethane | |
| 1,2,3,4-tetrabrombutane | |
| Hexabromoethane | U.S. PATENT NO. 3,056,673 |
| Benzotribromide | |
| Pentobromoethane | |
| Tribromoiodomethane | |
| Tribromoacetophenone | U.S. PATENT NOS. 3,121,632 and 3,121,633 |
| Sulfonylhalides | U.S. Patent No. 3,113,024 |
| Sulfenylhalides | U.S. Patent No. 3,113,024 |
| (2) NON-HALOGEN ACTIVATORS (DO NOT CONTAIN SULPHUR) | |
| Acetophenones | U.S. Patent Nos. 3,121,632 and 3,121,633 |
| Dichlorophenoxyacetic | U.S. Patent Nos. 3,140,948 and 3,140,949 |
| Carboxylic acids, Acyclic keto acids, Cyclic keto compounds | U.S. Patent No. 3,272,635 |
| Triazoles, Heterocyclic imides | U.S. Patent No. 3,284,205 |
| Benzophenones | U.S. Patent No. 3,445,232 |

3. SULPHUR CONTAINING ACTIVATORS - U.S. PATENT NO. 3,285,744

Mercapto compounds, such as mercaptobenzothiazole

Organic disulfides

Sulfides, such as Rhodamine or tetrazole

Thioureas and substituted thioureas

Acyclic thioacetanilides

See: U.S. Pat. Nos. 3,285,744; 3,342,595; 3,342,602

Substituted Rhodanine U.S. Pat. No. 3,342,603

Thiazolidinedione and substituted thiazolidenediones;

U.S. Pat. No. 3,342,604

U.S. Pat. No. 3,359,105:

Phenyl mercaptotetrazole

Methyl mercaptotetrazole

Ethyl mercaptotetrazole 2-mercaptobenzoxazole 2-mercapto-6-nitrobenzothiazole 2-mercapto-4-phenylthiazole 6-amino-2-mercaptobenzothiazole 2-mercapto-4-phenylthiazole 2-mercaptobenzoic acid with items from either Class 2 or Class 3 are utilized.

5. ADHESION AND ADHESION PROMOTERS WITH REGARD TO THE SUBSTRATE

A very important requirement of a photopolymerization system which is applied to a substrate for the various uses which have been defined in this specification is the ensurance that the developed-out photoresist will adhere firmly to the base. In many cases, this can be accomplished by special treatments of the surface. However the photoresist itself must act in a specific way in order to ensure this necessary property. First, the exposure must be sufficient that the resist is affected by light right to the interface between the substrate and the photopolymerizable system. This determines the extent of the exposure needed to obtain the degree of adherence required. For this reason, the light absorption at the wavelength which causes polymerization should be relatively high for the photoresist, and as defined in the section on "Color Formers" which are relatively transparent in the desired wavelength for the color formers, this representing one means for ensuring the adherence.

The problem of adhesion of the developed-out photoresist is particularly acute in the case of copper and its alloys and zinc and its alloys. While these materials may be given specialized surface treatments to ensure adhesion it is possible to add materials to the photocomposition itself which greatly increase the adhesion of the developed-out photoresist to the desired level. Representative suitable materials are listed in Table 7.

TABLE 7

ADHESION PROMOTERS

Note: Compounds marked (1) also increase speed; compounds marked (2) not only increase speed but also aid in color formation.

| | |
|---|---|
| (1) | Thiourea |
| (1) | 1-allyl-2-thiourea |
| (1) | 1,3-diethyl-2-thiourea |
| (1) | Thioacetamide |
| (1) | Thioacetanilide |
| (1) | Thiobenzanilide |
| (1) | Thiocarbanilide |
| (1) (2) | Thiosemicarbazide |
| (1) | Bis(dimethylthiocarbanyl)disulfide |
| (1) | Rhodamine |
| (1) (2) | 3-alkyl Rhodamines |
| (1) (2) | 3-phenyl Rhodamines |
| (1) | 2-mercaptobenzoxazole |
| (1) | 2-mercaptobenzothiazole |
| (1) | 2-mercapto-6-nitrobenzothiazole |
| (1) | 2-mercapto-4-phenylthiazole |
| (1) | 2-mercapto-4,6,6-trimethylthiazine |
| (1) | 2-mercapto-4-phenylthiazole |
| (1) | 2-mercaptopyridine |
| (1) | 2,2'-dithio-bis(benzothiazole) |
| (1) | 2,4-thiazolidinedione |
| (1) | α-mercaptoacetanilide |
| (1 | 1-phenyl-5-mercaptotetrazole |
| (1) | Bis-(2-quinolyl) disulfide |
| (1) | 2-mercapto-beta-napthothiazole |

It is noted that these are all sulphur compounds but these materials also serve other functions. Substantially all of them increase the speed of the photographic system to a noticeable degree, probably because the amount of exposure required to yield the desired degree of adhesion is lessened significantly. Certain of these compounds also aid in color formation and they are suitably marked in Table 7.

As indicated previously, adhesion to the base can be markedly improved by specialized surface treatments. In the case of copper and its alloys, immersion of the cleaned surfaces in a hot solution of iodine in alcohol for a few seconds, followed by washing in water and drying, yields a surface which is highly adherent to the photopolymer whether properly exposed or not. Normally, a solution of 10 percent iodine in ethyl alcohol or a higher alcohol is utilized. The temperature for treatment is at least 60° C. and the time for treatment is between 3 and 5 seconds. Adhesion is improved also whether the surface is chemically treated or not by abrasive cleaning of the surface with a household cleanser containing a detergent. Similar treatments are effective for zinc and its alloys. In addition, abrasion of the surface with steel wool, household cleansers, such as "Dutch Cleanser", oxalic acid plus abrasives and the like are also very effective.

In the case of metals and alloys containing chromium, thermal oxidation to the point of discoloration of the surface is an effective procedure. Normally, the metal base is heat treated in air at red heat for a few seconds in order to achieve this degree of oxidation. Another technique is to immerse the metal in molten sodium nitrate at 400° C for a few seconds to yield the desired coating. The sodium nitrate molten salt treatment is also effective for non-chromium containing iron and its alloys. Oxidation of aluminum either chemically, thermally, or by anodizing treatments produces the desired interface for aluminum metal. The majority of plastic surfaces yield more than adequate adhesion simply by proper choice of the solvent system which permits a slight bite into the surface of the plastic and produces a very firm bond. An exception to this situation is the use of polyesters of the polyethyleneterephthalate class as a base. In this case, adhesion is developed either through the use of a subbing which is comprised of mixtures of soluble co-polyesters, these showing solubility in organic halogen compounds and in hydrocarbons, and generally taken from the class of Vitels (manufactured by Goodyear Chemical Company), or again, as in the case of copper alloys ingredients may be added to the composition which develop adhesion without the use of the subbing layer. Acetophenone, benzophenone, and N-methylprollidinone are in this category. Amounts between 0.5 and 2 percent are sufficient for this adhesion promotion purpose though the compositions defined in this description will tolerate considerably larger amounts than these without harm to the photopolymerization properties.

B. THE BASIC FORMULATION AND RANGES

The basic formulations and preferred ranges of components provided by such basic formulations are given in Table 8 and Table 9. The procedure of preparation is normally to dissolve the hydroxy alkyl cellulose (defined as HAC in the tables) in the solvent and then to add the ingredients as listed in the tables thereafter consecutively, making certain that each ingredient dissolves completely before the next one is added to the solution.

TABLE 8

| SOLVENTS FOR HYDROXYALKYLCELLULOSE BASED PHOTORESIST SYSTEM |
|---|
| *Methyl cellosolve |
| *Cellosolve |
| Chloroform |
| *Dioxane |
| *Tetrahydrofuran |
| *Cyclohexanone |
| Toluene:ethanol 3:2 |
| Methylene chloride:methanol 9:1 |
| Methylene chloride |
| Benzene:methanol 1:1 |
| *Butyl acetate |
| *Methyl ethyl ketone |
| *Acetonitrile |

Solvents marked * are diluted advantageously with 10 to 50 parts of methylene chloride per 50 to 90 parts of solvent marked *.

TABLE 9

BASIC FORMULATIONS (Note: Hydroxyalkyl cellulose designated as HAC)

(A) Negative Working (No Special Precuations Relative to Oxygen)

| | Range | Preferred |
|---|---|---|
| N-vinyl amine (Table 1 (A)) | 5 to 350 g | 100 to 150 g |
| Color Formers (Table 5) | 0 to 30 g | 4 to 10 g |
| *Halogen Cont'g. Activator (Table 6(1)) | 20 to 200 g | 50 to 100 g |
| Cresols and/or phenols | 20 to 100 g | 30 to 40 g |
| Tri-aryl metal comp'd.(Sb,Bi,As, or P) | 2 to 20 g | 5 to 10 g |
| Adhesion Promoter (Table 7) | 20 to 100 g | 30 to 50 g |
| HAC (Mol. Wt. 25,000 to 75,000) | 300 to 1000 g | 400 to 600 g |
| Solvent (Table 8) | 3 to 12 liters | 4 to 8 liters |

Note *: Up to 50 percent of halogen activator may be replaced with activators taken from Table 6(2) and 6(3), or additions of activators from Table 6(2) and 6(3) up to 100 percent based on amount of halogen activator above may be added to the composition.

(B) Positive Working (No Special Precautions Relative to Oxygen)

| | Range | Preferred |
|---|---|---|
| N-vinyl amine (Table 1(A)) | 500 to 1000 g | 600 to 800 g |
| Color Formers (Table 5) | 2 to 30 g | 4 to 10 g |
| *Bromine or Chlorine Cont'g. Activators (Table 6(1)) | 50 to 300 g | 100 to 150 g |
| Cresols and/or phenols | 0 to 100 g | 5 to 40 g |
| Tri-aryl metal comp'd. (Sb,As,Bi, or P) | 0 to 20 g | 2 to 5 g |
| Adhesion Promoter (Table 7) | 20 to 100 g | 30 to 50 g |
| HAC (Mol. Wt. 150,000 to 900,000) | 600 to 1200 g | 700 to 900 g |
| Solvent (Table 8) | 7 to 20 liters | 10 to 12 liters |

Note *: Up to 50 percent of halogen activators may be replaced with activators taken from Table 6(2) and 6(3), or additions of activators from Table 6(2) and 6(3) up to 100 percent based on amount of halogen activator above may be added to the composition.

(C) Negative Working (Removal of Oxygen Necessary)

Same as Formula 9(A) except that the N-vinyl amines of Formula 9(A) are replaced in whole or in part with the N-vinyl imides or amides of Table 1(B).

(D) Positive Working (Removal of Oxygen Necessary)

Same as Formula 9(B) except that the N-vinyl amines of Formula 9(B) are replaced in whole or in part with the N-vinyl imides or amides of Table 1(B).

(E) Negative Working - Use of Ethylenically Unsaturated Compounds (REMOVAL OF OXYGEN NECESSARY)

| | Range | Preferred |
|---|---|---|
| Ethylenically Unsaturated (Vinyl Monomer) (Table 2) | 20 to 300g | 100 to 150g |
| N-vinyl compounds (Table 1) | 0 to 150g | 50 to 100g |
| Crosslinking agents (Table 3) | 0 to 3g | 0.5 to 1.0g |
| Initiation Promoters (Table 4) | 1 to 30g | 10 to 12g |
| *Halogen Cont'g Activator (Table 6(1)) | 20 to 250g | 50 to 100g |
| Tri-aryl metal comp'd. (Sb, Bi, As, or P) | 0 to 20g | 0 to 10g |
| Cresols and/or phenols | 0 to 100g | 0 to 30g |
| Adhesion Promoters (Table 7) | 0 to 100g | 0 to 50g |
| HAC (Mol. Wt. 25,000 to 75,000) | 300 to 1000g | 400 to 600g |
| Solvent (Table 8) | 3 to 12 liters | 4 to 8 liters |

*NOTE: The halogen activator may be replaced in whole or in part by the sulphur containing activators of Table 6(3) and in part (not more than 50 percent) by the non-halogen activators of Table 6(2); when combinations are used the most effective combination is 50 to 75 parts of the halogen activator of Table 6(1) plus 50 to 25 parts of the sulphur containing activator of Table 6(3) for each 100 parts of the combination.

1. DETAILS OF FORMULATION AND COMPOSITION: THE NEGATIVE WORKING SYSTEMS

Compositions as defined in Table 9 are applied to the desired and suitably prepared substrate including metals, plastics, glass, wood and textiles by any one of several methods. These methods include roller coating, drawbar coating, dip coating, spray coating, spin coating and other known coating methods. For extremely thin coatings as required in microelectronics, spin coating is the preferred procedure though meniscus coating from dilute solutions can be utilized if broad areas are involved. After the coating has achieved its set which takes place normally in a few seconds after coating, the material is dried for 10 to 30 seconds at 90° C. in a convection type oven. When liquid monomers as defined in Table 2 are utilized, the usual procedure is to permit the material to dry at room temperature which generally takes a time period of 3 to 5 minutes for complete drying.

For negative working systems, the composition is then exposed through a suitable mask to ultraviolet light, unless the material has been specifically sensitized to the visible by the use of color formers which rapidly produce dyes which are capable of sensitizing the system to the visible. Dyes which are capable of accomplishing this sensitization to the visible include methylene blue, the anthraquinones, the indigoids, isoviolanthrone, and the like. Color formers which sensitize to the visible and are included in Table 5 include styryl dye bases, the cyanine dye bases, the carbinol bases, the merocyanines, the leuco xanthanes, the leuco dihydroxy anthracenes, rubrene, and Rhodamine B base. However, from a practical standpoint the usual procedure is to utilize a color blind material which does not contain these types of sensitizers so that dim roomlight or bright yellow light may be used with impunity. Under these conditions, exposure is carried out by exposing the composition to radiation in a wavelength range between 3,500 and 3,800 A. This wavelength is easily furnished by the so-called mercury black lights which may be a medium pressure mercury arc, fitted with a Corex (Corning Glass Company) filter which cuts out the visible light but transmits freely in the ultraviolet. Fluorescent lamps fitted with a special phosphor (manufactured by Sylvania) known as "fluorescent black lights" may also be used and this special phosphor yields a high energy output in the desired wavelength range. Other lamps which may be used are lamps such as xenon mercury lamps doped with various metal halides. Carbon arcs may also be used with or without filters though normally better results are obtained if the visible light is eliminated with the use of such filters.

Depending on application and thickness of the resist, exposures vary from fractions of a second up to 3 minutes, the longer exposures (i. e., longer than 40 seconds) being used only for certain specialized versions of the positive working system. The usual exposure range of the negative working systems is between 0.1 and 40 seconds depending on whether the system is optically developed or not.

Electron beam exposures are made with accelerating voltages ranging between 1 and 50 kilovolts, the thicker the dried photoresist, the higher the voltage. For example in thick film technology, the dried film thickness is in the range of 2 to 3 mils, and driving voltages for the electron beam in the range of 30 to 50 kilovolts are utilized. This voltage drops successively as the thickness is reduced. In the microelectronic field, where the thickness of the photoresists are in the range of 1 to 5 microns, usually accelerating voltages in the range of 1 to 3 kilovolts are utilized. Beam currents used are generally in the range of 20 to 50 microamperes. Dwell time of the electron beams of the foregoing descriptions varies from fractions of a microsecond up to 3 microseconds and again the thicker the resist, the longer the dwell time. Trace velocities for full exposure of the photoresist to the electron beam may be varied from approximately 1,500 centimeters per second up to $5 \times 10^6$ centimeters per second. The higher the voltage, the higher the current density and the thinner the photoresist, the higher the writing speed for a particular spot size of the electron beam. The spot sizes used vary from a fraction of a micron in diameter up to 50 microns.

When an exposure to ultraviolet light is utilized with the previously described sources an amount of energy at the image plane between 20 and 150 millijoules per square centimeter is normally required for full exposure of the resist and ensurance of exposure all the way through to the back of the resist so that adequate adherence is obtained. This time of exposure can be reduced by a factor of 10 to 100 through the use of the procedure which may be defined as optical development. This involves a subsequent blanket exposure of the previously exposed material to a wavelength of light longer than that to which the resist itself is sensitive and at a wavelength range to which the printed out color formed by the initial exposure absorbs light. Thus, for the normal color blind system which exhibits a print-out color, bright yellow lights such as may be available from a sodium lamp obtained by striking an arc in sodium metal vapor in a transparent aluminum oxide envelope may be utilized. These lamps are tradenamed "Incalox" and are manufactured by General Electric. For materials which are visible light sensitive, red light or infrared light is used for the same purpose. The amount of light used in the optical development step is generally of the order of 1,000 millijoules per square centimeter and may be completed in a very short time because of the extreme light intensities which are available from these yellow or red light sources, the blanket exposure, and the capability for placing these lamps very close to the surface since no concern with collimation or resolution accuracy exists in accomplishing this step. The normal procedure is to move the previously light exposed specimen at a rated speed underneath these lights with a separation distance of usually one half to one inch. Under such conditions, the operation of working systems as described in this disclosure can be exposed with an initial light exposure not exceeding a fraction of a second and in usual cases in the range of 0.01 to 0.1 seconds. The optical development step can generally be completed under the conditions described in a range of 10 to 200 seconds time. The time is dependent primarily not only on the degree of absorption of the dye which is formed in the initial light exposure step but on the efficiency of energy transfer from the energy absorbed by the dye itself to the complex which produces the color and resist insolubilization in the first place.

After exposure has been completed, and again for negative working systems only, the system is then heated in a temperature range between 150° C. and 250° C. in a convection oven. The time and the temperature utilized is a function of the type of activator used. For example, if the activator is iodoform, the time is 1 to 2 minutes at 170° C. and 15 to 30 seconds at 250° C. If the activator is a combination of iodoform and a sulphur containing compound as shown in Table 6(C), the time is then generally 30 seconds at a temperature of 250° C. If the activator is carbon tetrabromide, the time is 30 seconds at 150° C. In general, when halogen activators are used, the time is a function of the boiling or sublimation temperature of the activator used. The higher the boiling point, the longer the time and the higher the temperature.

After the light and heat exposure treatment in accordance with the foregoing description, the unexposed portions of the resist are then removed by spraying with substantially pure water. The water may be either distilled water or deionized water and the temperature at which the water is applied to the surface is between 40 and 50 degrees C. Spraying accomplishes the elimination of the unexposed portions of the resist very cleanly in a time period of 10 to 30 seconds. The unexposed portions may also be removed by simple immersion in water for a period of about 1 minute. If the surface is rubbed while being immersed with a soft sponge, the time of immersion is reduced to a period of between 10 and 30 seconds. This removal of the unexposed portions places the system in a condition in the unexposed portions so that the bare substrate is now revealed. Various chemical treatments at elevated temperatures can now be applied to fit the resist for the applications which have been defined in this specification. These types of treatments normally but not always involve etching and will be specified in various examples.

2. THE POSITIVE WORKING SYSTEMS

While all of the compositions given in Table 9 can be made to yield a positive working characteristic through manipulation, the best performance from a practical standpoint is obtained through use of a composition containing a relatively high proportion of the ethylenically unsaturated monomer within the ranges as defined in Table 9 (B) and in Table 9 (D).

The first procedure involves an exposure such that the amount of image forming energy placed on the film plane is generally of the order of a factor of 10 or greater than that required to yield a negative working manifestation. This exposure is in the range of 1000 to 1500 millijoules in a wavelength range between 3,500 and 3,800 A. After such exposure, the system is then heated for 30 seconds at 90° C. and it is then given a blanket exposure again to a wavelength range of 3,500 to 3,800 A at a level of energy equivalent to that normally required to yield negative working characteristics. This exposure is between fractions of a millijoule per square centimeter in the case where optical development is utilized and up to about 100 millijoules in the event that optical development is not utilized. After this blanket exposure, the system is then fixed and developed as before, namely, heating in an air convection oven in a temperature range between 170° C. to 250° C. for time periods at the upper level which are not less than 15 seconds and for time periods at the lower level of this temperature range of not less than 1 minute. After this heat treatment, the system is then washed with relatively pure water of the type previously described (distilled or deionized) at a temperature range between 40 and 50 degrees C. for about 1 minute. As a consequence of this treatment, the sections of the image which have been given the extremely lengthy initial exposure strip off very cleanly whereas the material which has been given the shorter exposure remains firmly fixed to the substrate, thus yielding a positive rendition of the original image.

A second technique which, in some cases, is much simpler to perform involves an initial imagewise exposure, again in the spectral range of 3,500 to 3,800 A for an extremely short length of time. This exposure is of the order of fractions of a second, generally in the range of 0.001 to 0.01 seconds, and with an energy rating at the image plane not in excess of 1 millijoule per square centimeter. Thereafter, the system is heated for 30 seconds at 90° C. and then given a blanket exposure for the normal length of time as recommended for negative working systems again to light in the range of 3,500 to 3,800 A. This blanket exposure will generally involve the application of 25 to 150 millijoules per square centimeter at the image plane. On spray washing with water, as before, in the temperature range of 40° to 50° C., the material which has been given the initial short exposure washes off, whereas the portions of the image which have not been previously exposed but which have been exposed only to the blanket lengthy exposure remains firmly adherent to the substrate, thus again yielding a positive rendition of the original image.

A third technique is recommended when exceptionally high resolution results are required. This involves making the initial imagewise exposure in a wavelength range of 3,000 to 3,200 A, again followed by heating for a period of time no longer than 30 seconds at 90° C. in a convection type oven. In view of the short wavelength, photomasks are required which transmit these wavelengths freely. Such photomasks may be made from etched metal, or more suitably from systems on a polyethyleneterephthalate base and as described in U.S. Pat. No. 3,533,792. In this procedure, the heat treatment at 90° C. is not entirely necessary providing the sample is allowed to stand in the dark for a period of at least one hour after imagewise exposure. Following either the heat treatment or the holding of the initially exposed specimen in the dark for an hour, the system is then given a blanket exposure to a wavelength range of 3,500 to 3,800 A for the usual length of time required to produce a negative rendition. Again, after washing with pure water in a temperature range of 40° to 50° C. applied by spray, the portions initially exposed to the very short ultraviolet light wash off leaving the remainder firmly adherent to the substrate, thus giving a positive rendition of the original image.

In the cases just described, the base systems are those which had not been sensitized particularly to wavelengths longer than 4,000 A. When the system contains color formers or sensitizing materials which extends the sensitivity to much longer wavelengths, the wavelength of exposures may be regulated accordingly with regard to the subsequent blanket exposure only. As an example, if rubrene is utilized as an additive to the system for sensitizing into the wavelength range of 4,500 to 5,500 A, the initial exposures for producing the positive rendition are made as described in the foregoing sentences no matter which mode of producing the positive rendition is utilized. The blanket exposure thereafter normally can be made at wavelengths up to 5,500 A and preferably in a bandwidth of 4,000 to 5,500 A in order to give the desired insolubility to the material which has not been previously exposed to the wavelength range required to give the positive rendition.

While not intending to be bound to any specific theory, the evidence appears to indicate that under the conditions described for negative working purposes, that the photopolymerization reaction which takes place is a crosslinking type between the ethylenically unsaturated compound (which include the N-vinyl compound) and the base polymer, hydroxypropyl cellulose. However, it appears, and this has not been proved with any degree of definity, if the exposure is made in the manner in which one would obtain positive renditions, the evidence appears to indicate that the polymerization of the ethylenically unsaturated monomer takes precedence over the crosslinking reaction to the extent that it is effectively removed in these areas as the result of the light induced reaction so that the amount of crosslinking is either reduced very substantially or eliminated entirely and the insolublization characteristic which develop as a consequence of the presence and reaction of these two components can no longer be developed.

While cresols and phenols have been defined as effective stabilizers for the composition, both in solution form and in the form of pre-sensitized plates, a more complete description is given in U.S. Pat. No. 3,351,467. It has been found that small amounts of the inhibitors which were defined in the referred to patent are effective for the purposes of this description. These may be taken from the class of hydroquinone, benzoquinone, 1-phenyl-3-pyrazolidone, 2,6-di-t-butyl-p-cresol, and 2,6di-t-butyl-p-phenol. Of these various stabilizers, the 2,6 cresol and 2,6 phenol compounds are preferred.

EXAMPLE 1

A composition was made up in accordance with the recipe following:

| | |
|---|---|
| (Vinyl monomer) | 150 g of N-vinylcarbazole |
| Stabilizer) | 50 g of 2,6-di-tert-butyl-p-cresol |
| (Stabilizer) | 10 g of triphenyl stibine |
| (Adherence Promoter) | 50 g of 3-ethyl-Thodanine |
| (Activator) | 100 g of $CHI_3$ |
| (HPC Binder) | 400 g of hydroxy-propyl-cellulose (MW 50,000) |
| Solvents: | 4000 cc's of methylene dichloride |
| | 2000 cc's of tetrahydrofuran |

Hydroxy propyl cellulose was dissolved in the methylene chloride; when completely dissolved, other agents were added in order given making certain each agent was completely in solution before the next reagent was added; then tetrahydrofuran was added to complete coating formulation.

Using a doctor blade, a 3 mil wet thickness of the above formulation was applied to subbed polyethyleneterephthalate. The composition was allowed to stand on the base for about 10 seconds and then placed in an oven at 90° C for 30 seconds. Thereafter, it was exposed to a 21 square root of two stepwedge for a total exposure of 150 millijoules utilizing black light fluorescent lamps as the exposure source. This exposure source was comprised of seven 15-watt fluorescent tubes, 18 inches in length and approximately 1 inch in diameter. All of these operations were carried out under red light. A faint colored image was evident after exposure. After exposure, the sample was fixed by placing in an air flow oven for 90 seconds at 170° C. The image portions were yellowish-green color, whereas the non-image portions were colorless. The H and D curve was then plotted by measuring the density of each step through a blut filter on a densitometer. The D-max. was 2.22 and the speed required to achieve a density of 1.0 above base plus fog (0.11 units of density) was 21 millijoules.

The stepwedge was again measured without a filter with an ultraviolet densitometer utilizing the 3,660 A mercury line for measurement purposes. In this case, the D-max. was 3 plus and the energy required to yield a density of 1.0 above base plus fog (base plus fog was 0.17 units) was 0.8 millijoules.

EXAMPLES 2 TO 10

OTHER OXYGEN INSENSITIVE N-VINYL AMINES

The same procedures as described in Example 1 were utilized for Examples 2 to 10, and the results obtained are compiled in the table following. In measuring the sensitometry in the visible, in order to determine the number of millijoules required to yield a density of 1.0 above base plus fog, wherever the image was colored, a complementary colored filter was used in the sensitometer. For example, in the case of N-vinylindole, the filter used in the sensitometer was blue; in the case of Example 3, the filter used in the sensitometer was ma-

| | VINYL AMINE | IMAGE COLOR | SPEED IN VISIBLE mj/cm² | VISIBLE D-MAX. | SPEED AT 3660 A mj/cm² | U.V. D-MAX. |
|---|---|---|---|---|---|---|
| 2. | N-vinyl indole | red-brown | 16 | 2.7 | 0.8 | 3+ |
| 3. | N-vinyl phenyl-alpha-napthyl-amine | green | 12 | 2.4 | 1.4 | 2.7 |
| 4. | N-vinyl diphenyl-amine +0.1% cyclohexylamine | blue | 8 | 2.0 | 2.1 | 2.6 |
| 5. | N-vinyl pyrolle | opaque white | 31 | 3+ | 0.1 | 3+ |
| 6. | 3-(2-hydroxy-1-naphthylazo 1-9-vinyl carbazole | blue | 18 | 1.9 | 2.5 | 2.6 |
| 7. | 3-(9' xanthyl)-9-vinyl carbazole | blue | 18 | 1.6 | 4.0 | 2.9 |
| 8. | 3-vinyl-(2'3':3,4)- | blue | 18 | 1.6 | 4.0 | 2.9 |
| 9. | 3-indole-phenol-9-vinyl carbazole | blue | 7 | 3+ | 0.05 | 3+ |
| 10. | 3-indole-phenolazo-9-vinyl carbazole | blue | 6 | 3+ | 0.01 | 3+ |

genta; in the case of Example 4, the filter used in the sensitometer was red; in the case of Examples 6 through 10, the filter used in the sensitometer was red; and no filter was used in the case of Example 5. The base plus fog in the visible for Examples 2 through 10 was generally in the range of 0.07 to 0.12, and in the ultraviolet at 3,660 A the base plus fog was generally between 0.1 and 0.2. No filter was used in measurement in the ultraviolet. The D-max. figures given in the table are the values achieved above base plus fog.

EXAMPLES 11 TO 44

EFFECT OF COLOR FORMERS

The color formers listed in Examples 11 to 44 were added to the composition given in Example 1. The table is self-explanatory relative to Examples 11 to 44 with regard to the amounts utilized and the color produced. The speed of color formation varied with the type of color former. In the case of the use of dye intermediates as exemplified by Examples 8 through 23 and Example 39, the speed was roughly identical to that reported for Example 1 when treated exposurewise and otherwise as defined in Example 1. The addition of leuco diphenylmethanes as exemplified by Examples 11 through 13 yielded speeds approximately twice that reported for Example 1 with regard to color formation. The speeds of the color formers based on the leuco triphenylmethane class as exemplified by Examples 14 through 17, the dye bases as exemplified by Examples 25, 28, 29, 30, 31, 34, were approximately four times the speed shown in Example 1, whereas the photographic speeds for the examples containing such compounds as the lueco anthracenes, the leuco dihydroanthracenes, the leuco xanthenes, the lueco thioxanthenes, the leucoanthraquinones, were five to ten times faster than that shown in Example 1. The speeds shown when a dye was added, such as Examples 32 and 33 were approximately the same as those shown in Example 1, whereas the speeds involving color coupling as shown in Examples 40 through 43, the speeds were approximately twice that as shown in Example 1. Otherwise, the performance of the system was roughly the same, except for the noted exceptions in photographic speed and differences in color formation.

| | NAME | TYPE | AMT | COLOR PRODUCED |
|---|---|---|---|---|
| 11. | 4-4'bis(paradimethyl-amino) diphenylamine | Leuco diphenylmethane | 3g | Copper |
| 12. | 1-1'-bis-(p-dimethyl-aminophenyl (ethylene | Leuco diphenylmethane | | Green-black |
| 13. | bis-(4,4'-dimethyl-aminophenyl)-amino-methane | Leuco diphenylmethane | | Bronze |
| 14. | 4,4',4'' methyl identris(N,N-dimethylaniline) | Leuco triphenylmethane | 3g | Yellow |
| 15. | p,p'-benzylidene bis-(N,N-dimethylaniline) | Leuco triphenylmethane | 5g | Green |
| 16. | p,p'p''-triaminotri-phenylmethane | Leuco triphenylmethane | 7g | Red |
| 17. | p,p'p''-triphenyl-aminomethane | Leuco triphenylmethane | 5g | Yellow-Brown |
| 18. | Indole | Dye intermediate | 10g | Brown |
| 19. | Diphenylamine | Dye intermediate | 10g | Brown-Yellow |
| 20. | Phenyl skatole | Dye intermediate | 10g | Yellow |
| 21. | 3-methyl skatole | Dye intermediate | 10g | Brown-Black |
| 22. | Carbazole | Dye intermediate | 10g | Magenta |
| 23. | Xanthhydrol | Dye intermediate | 10g | Blue |
| 24. | Michler's hydrol | Carbinol base | 5g | Green-Blue |
| 25. | Carbinol of Opal Blue 2SS(C.I. 42760) | Triphenylmethane dye base | 3g | Blue |
| 26. | Rubrene | Polyacene - dye intermediate | 15g | Green |
| 27. | Rhodamine B Base | Dye base | 5g | Scarlet |
| 28. | 4-p-dimethylamino-styryl quinoline | Styryl dye base | 4g | Purple |
| 29. | 2-(3-ethyl-2(3H)-benzothiazolylidene) propenylbenzathiazole | Cyanine dye base | 2g | Blue-Black |
| 30. | 2-[(3-ethyl-2(3H)-benzothiazolylidene)-ethylidene]-aminobenzothiazole | Cyanine dye base | 3g | Brown-Black |
| 31. | 2-p-dimethylamine-styrylquinoline | Styryl dye base | 4g | Brick red |
| 32. | 3-ethyl-5-[(3-ethyl-2(3H)-benzoxazolylidene) ethylidene]rhodanines | Merocyanine dye | 7g | Red-Brown |
| 33. | 1-ethyl-3-[(3-ethyl-2(3H)-benzoxazolylidene)-ethylidene]-oxindole | Merocarbocyanine dye | 3g | Brown |
| 34. | 3-ethyl-5-(3-ethyl-2(3)-benzothiazolylidene)-2[3-(2-quinolyl) -allylidene]-4-thiazalidene | Merocyanine dye base | 3g | Brown-Black |
| 35. | 2,7-bis(dimethylamino)-9, 10-dihydro-9,9-di-methylanthracene | Leuco dihydroanthracene | 5g | Blue |
| 36. | 3,6-bis(dimethylamino)-9-methyl xanthene | Leuco xanthene | 10g | Blue-Green |
| 37. | 3,6-tetramethyldiamino 10-thioxanthene | Leuco thioxanthene | 10g | Yellow-brown |
| 38. | 1,4-diamino-2,3-dihydroanthraquinone | Leuco anthraquinone | | Yellow-Green |
| 38*a*. | 1,4-dihyroxyanthra-quinone | Leuco anthraquinone | 5g | Yellow |

Table – Continued

| | NAME | TYPE | AMT | COLOR PRODUCED |
|---|---|---|---|---|
| 39. | 2,4-dimethyl-3-ethyl-pyrolle | Dye intermediate | 50g | Brown-Black |
| 40*a*. | (1,1-bis-p-dimethyl-amino-phenyl ethylene) plus | Color coupling | (*a*) 100g | Blue-Black |
| 40*b*. | (2-mercaptoacetanilide) | | (*b*) 20g | |
| 41*a*. | 1,1-bis-p-dimethylamino-phenyl ethylene plus | Color coupling | (*a*) 50g | Violet-Black |
| 41*b*. | 1-phenyl-3-amino-pyrazol-5 one | | (*b*) 10g | |
| 42*a*. | 1,1-bis-p-dimethyl-aminophenyl ethylene plus | Color coupling | (*a*) 100g | Green-Black |
| 42*b*. | Acetanilide | | (*b*) 50g | |
| 43*a*. | 1,1-bis-p-dimethyl-aminophenyl ethylene plus | Color coupling | (*a*) 100g | Black |
| 43*b*. | 1-phenyl-3 amino-pyrazol-5-one plus | | (*b*) 20g | |
| 43*c*. | 2-mercaptoacet-anilide | | (*c*) 20g | |
| 44. | 3,6-bis-(dimethylamino)-9-(p-dimethylaminophenyl) xanthene | Leuco xanthene | 50g | Magenta |

EXAMPLES 45 TO 60

EFFECT OF DIFFERENT ACTIVATORS

The effect of change in activators taken from Table 6 was then traversed and the results are given in Examples 45 through 60. For Examples 45 through 54, the composition was identical with Example 1, except that the activator listed was utilized as a replacement for the iodoform given in Example 1. For Examples 55 through 60, the compositions were identical with the ingredients given for Example 44 which included the leuco xanthene color former, except that the iodoform used for Example 44 was replaced with the activator of the type and amount indicated in the table. The photographic information available from Example 1 and Example 44 processed in accordance with the treatment defined in Example 1 are given in this table of examples in their appropriate place for ease of comparison.

| | ACTIVATOR | | AMT. | COLOR | SPEED IN VISIBLE MJ/CM² | D-MAX. | SPEED 3660 MJ/CM² | D-MAX. |
|---|---|---|---|---|---|---|---|---|
| 1. | Iodoform | | 100g | Yellow-Green | 21 | 2.22 | 0.8 | 3+ |
| 45. | Hexachlorethane | | 150g | Green | 55 | 1.7 | 5.0 | 2.1 |
| 46. | Pentabromethane | | 150g | Brown | 40 | 1.9 | 4.0 | 2.3 |
| 47. | Tribromacetophenone | | 150g | Brown-Black | 25 | 2.3 | 3.0 | 2.4 |
| 48a. | $CBr_4$ plus | (a) | 100g | Brown-Black | 11 | 2.7 | 2.0 | 3+ |
| 48b. | 2-mercaptobenzo thiazole | (b) | 20g | | | | | |
| 49a. | $CBr_4$ plus | (a) | 75g | Black | 6 | 3+ | 0.01 | 3+ |
| 49b. | Phenylmercapto-tetrazole | (b) | 25g | | | | | |
| 50a. | Pentabromethane plus | (a) | 150g | Brown-Black | 9 | 3+ | 0.01 | 3+ |
| 50b. | 2-mercaptobenzoxazole | | 50g | | | | | |
| 51a. | Iodoform plus | (a) | 75g | Green-Black | 8 | 3+ | 0.01 | 3+ |
| 51b. | 2-mercapto-4-phenyl-thiazole | (b) | 25g | | | | | |
| 52a. | Iodoform plus | (a) | 75g | Green-Brown | 3 | 3+ | 0.01 | 3+ |
| 52b. | Diphenyldisulfide | (b) | 25g | | | | | |
| 53. | Diphenyldisulfide | | 100g | Green-Yellow | 80 | 1.1 | 0.6 | 2.6 |
| 54a. | Iodoform plus | (a) | 100g | Green | 14 | 2.4 | 0.7 | 2.4 |
| 54b. | Rhodanine | (b) | 50g | | | | | |
| 44. | $CHI_3$ | | 100g | Magenta | 5 | 2.8 | 0.7 | 3+ |
| 55. | 3-napthyl isoxazolone imide | | 25g | Blue | 40 | 1.4 | 11 | 2.6 |
| 56. | 1-phenyl-3-beta-napthyl-5-pyrazalone imide | | 25g | Blue | 35 | 1.2 | 9 | 2.7 |
| 57. | Benzotriazole | | 25g | Magenta | 25 | 1.7 | 6 | 3.0 |
| 58. | Example 55 +$CHI_3$ | | 100g | Blue-Black | 3 | 2.8 | 0.1 | 3+ |
| 59. | Example 56 +$CHI_3$ | | 100g | Blue-Black | 3 | 2.6 | 0.2 | 3+ |
| 60. | Example 57 +$CHI_3$ | | 100g | Reddish-Black | 3 | 2.9 | 0.1 | 3+ |

EXAMPLE 61

THE EFFECT OF ADHERENCE PROMOTERS ON SHEET COPPER

The sheet copper in each case was prepared by scrubbing the surface with an abrasive cleanser containing a detergent ("Dutch Cleanser") utilizing a wet sponge for the process, washing off the detergent containing cleanser with water, followed by a methyl alcohol wash and permitting the copper to dry. The 3-ethyl Rhodanine listed as part of the composition of Example 1 was omitted from the composition and under red light conditions a 6 mil wet thickness of the composition was then laid down on the surface of the cleaned copper with a doctor blade. After drying in the oven as described in Example 1, the dried surface was then given a blanket exposure to the fluorescent black lights (which emit strongly at a wavelength range from 3,800 A to about 3,000 A with a peak emission in the 3,500 to 3,700 A) for a sufficient amount of time to yield an exposure of 150 millijoules. Thereafter, the exposed specimen, which contained a print-out image, was heated in an oven at 170°C. for 3 minutes. Treatment with cold water, after cooling, showed no effect on the fully-exposed and developed resist. The specimen was again dried and a piece 1 inch in width, and 8 inches long, was cut out of the specimen with a diamond saw. The bond between the developed and exposed resist film and the copper was then tweezed open with a razor blade and the peel strength then measured and found to be 12 lbs. per lineal inch.

The experiment was repeated, using this time a composition identical with that given in Example 1 (i.e., containing the 3-ethyl Rhodanine) and the peel strength again measured as before. The peel strength was found to be 80 lbs. per lineal inch.

The adhesion promoters listed in Table 7 were then utilized as replacements for the 3-ethyl Rhodanine listed in Example 1 on a gram-for-gram basis and processed as defined above. The peel strength measurements for each of these items varied between 50 and 100 lbs. per lineal inch. All of the mercapto compounds uniformly produced a peel strength of approximately 100 lbs. per lineal inch, the rhodanines between 70 and 80 lbs. per lineal inch, whereas the remaining compounds showed peel strengths in the range of 50 to 60 lbs. per lineal inch.

The thickness of the dried film thus peeled off from the surface of the copper was approximately 1 mil.

EXAMPLE 62

ANODIZED ALUMINUM AS A BASE

Commercially pure (at least 99.8 percent aluminum) aluminum sheet generally designated in the trade as "Lithographer's Aluminum" was anodized to produce an anodized layer thereon of 0.35 mils in thickness, the base aluminum having an original thickness of 12 mils. Thereafter, the composition in accordance with Example 12 was roller coated onto this anodized aluminum at a wet film thickness of 3 mils. after which the coating was dried for 30 seconds at 90° C. The film thickness, after drying, was approximately 0.5 mils. The plate was then exposed through a negative to the fluorescent black light described previously so that an exposure of 50 millijoules per square centimeter was obtained, this requiring exposure with the light source utilized (approximately 100 watts of fluorescent black light) at a distance of 5 inches of about 20 seconds. After the exposure through the negative, the plate was then developed and fixed with regard to photographic sensitivity by heating at 250° C. for 20 seconds. After cooling, the plate was then washed in deionized water, utilizing a spray wash, and the water was maintained at a temperature of 40 to 50 degrees C. The areas which had not been exposed to light washed off leaving the anodized layer exposed, whereas the areas which had been exposed to light were unaffected by the water wash and were a black-green color.

EXAMPLE 63

The plate as prepared in Example 62 was immersed for 90 seconds at 95° C. in a water solution containing 0.5 percent nickel acetate, 0.5 percent cobalt acetate, and 2 percent boric acid in distilled water. After this treatment the plate was washed with cold water and allowed to dry.

Evaluation of this plate on the lithographic press indicated excellent working properties for a long run lithographic printing of the planographic variety. Very clean, sharp images were obtained of high resolution. On a dot pattern resolution chart, dot patterns between 5 percent and 95 percent filled were easily reproduced with clean, sharp edges.

EXAMPLE 64

A plate prepared as defined in Example 62 was etched for 2 minutes at 85° C. in a solution containing 35 cc's of 85 percent phosphoric acid and 20 grams of chromic acid in 1,000 cc's of water. The developed resist was unaffected by this solution and examination under the microscope indicated that the anodized layer had been removed down to the bare metal. Measurement of the thickness of the areas coated by resist, including the thickness of the resist, indicated that the height between the top of the resist and the bare aluminum plate was approximately 0.4 mils. This plate was found to work very effectively in dry lithography, where a water fountain is not required, with retention of resolution and showing very clean, sharp edges.

EXAMPLE 65

A plate made as defined in Example 62 was etched in 10 percent potassium hydroxide in water for 30 seconds at 80° C. The potassium hydroxide solution contained approximately 2 percent gum arabic. A clean etch was obtained without affecting the areas which had been previously exposed to light and processed as defined in Example 62. The height of the land colored by the photoresist down to the bare metal was approximately 1 mil and this plate was found to exhibit good working properties in a dry letterpress operation.

In a variation of this example, an aluminum plate approximately 30 mils thickness was anodized as defined in Example 62, except in this case the anodized layer was 0.1 mil in thickness. It was then etched after exposure, development and roller processing, in the potassium hydroxide-gum arabic solution defined in the previous paragraph for 3 minutes at 80° C. The distance between the top of the photoresist and the bare metal thus exposed by the caustic etching was found to be between 3 and 4 mils and, again, the plate performed in excellent fashion as a letterpress medium.

EXAMPLE 66

A copper sheet approximately 0.7 mils thick was heat laminated to a polyethyleneterephthalate base which had been previously fitted with a heat sealable adhesive specially designed for the purpose. Thereafter, under red light conditions the copper surface was then coated with a 3 mil wet thickness of a composition in accordance with Example 12. After drying for 30 seconds at 90° C., the surface was then exposed to a line negative representing a printed circuit test pattern. This test pattern contained a series of lines varying in width from 5 microns to 150 microns, and varying in separation from each other from 5 microns to 50 microns. The test pattern also contained a replica of holes varying in diameter from 25 microns to 150 microns. After an exposure of 100 millijoules to the fluorescent black light (time period of approximately 40 seconds) the specimen was then heated for 90 seconds at 170° C. After cooling, the specimen was spray washed in deionized water for 30 seconds at 40 to 50 degrees C. This treatment removed the resist from the unexposed areas and revealed bare copper, whereas the copper which contained exposed areas was now covered with a dark green or black-green surface layer. The specimen was then placed in a spray etcher operating at 100° F. in which the etching solution consisted of 40 parts of hydrated ferric chloride, 10 parts of concentrated hydrochloric acid, and 50 parts of water. The etching was complete in about 45 seconds and a clean rendition of the test pattern in copper was obtained on a flexible base and firmly adherent to said base. Both the 5 micron lines and the 25 micron holes were duplicated.

EXAMPLES 68 THROUGH 72

PHOTOMECHANICAL MILLING-SPRAY ETCHING

The resist compositions given in Column 3 of the following table were laid down in a 3 mil wet thickness on the base material defined in Column 2 of the table. These were processed photographically in a red light darkroom in accordance with the teachings of Example 62. After water washing and etching in accordance with the teachings of Columns 4 and 5 of this table, the color of the exposed resist remained as defined in Column 6 of the table. The exposed resist and its independent color is removed by spray washing in acetone after the etching treatments defined in Column 4.

Treatment of the various surfaces in order to ensure ample adhesion is defined generally in Column 2. The pre-oxidation of nickel and stainless steel is accomplished by heating for a few seconds in air at red heat. The silver is made ready for adhesion simply by abrading with the abrasive cleanser containing a detergent in the same manner as described for copper. The glass surface must be scrupuously clean which is usually accomplished by dipping in hot concentrated sulphuric-chromic acid solution as normally used in the laboratory for the cleaning of glass, washing off the solution with water, then washing off with methyl alcohol and allowing to dry and applying the resist immediately thereafter.

After processing and etching as described in the foregoing and in the following table, the exposed resist on the unattacked lands is removed easily by a spray washing in acetone for 5 seconds.

| EXAMPLE 23 | BASE MATERIAL | RESIST ETCHANT | 3 MIL DEPTH | TIME TO DEVELOPMENT | COLOR OF COMPOSITION |
|---|---|---|---|---|---|
| 68 | Glass | Example 11 | 20% hydrofluoric<br>5% ammonium bi-fluoride<br>75% water (150°F) | 20 minutes | Copper |
| 69 | Nickel Pre-oxidized | Example 27 | 40% hydrated $FeCl_3$<br>10% conc. HCl<br>50% water (100°F) | 4 minutes | Scarlet |
| 70 | Silver | Example 35 | 40% hydrated $Fe(NO_3)_3$<br>10% conc $HNO_3$<br>5% water (200°F) | 3 minutes | Blue |
| 71 | Pre-oxidized Stainless Steel | Example 43 | Same as No. 69 | 8 minutes | Black |
| 72 | Zinc (grained) | Example 34 | 30% conc. $HNO_3$<br>2% gum arabic<br>68% water (approx. 75 to 85°F. | 2 minutes | Brown-Black |

EXAMPLE 67

Same as Example 66, except that the resist was applied to a glass fiber-epoxy circuit board containing on its surface an adhered sheet of copper, approximately 2.5 mils thick. After photographic processing and water washing, etching time was approximately 3 minutes before the bare epoxy board was revealed in the unexposed areas. Again, the 5 micron lines and the 25 micron holes were duplicated. For each of Examples 66 and 67, the exposed resist after completion of the etching operation was removed by washing with acetone.

EXAMPLE 73

ELECTRON BEAM RECORDING

A 1 inch square of polished semi-conductor grade silicon was heated in air at 800° C. for 5 minutes and allowed to cool.

The resist composition in accordance with Example 12 was diluted with an equal volume of toluene. The resist composition was then spun coated at 6000 rpm onto the oxidized silicon surface under red light conditions and allowed to dry at room temperature, after which the specimen was heated for 10 seconds at 90° C. The thickness of the dried film resist was between 1 and 2 microns.

The sample was then inserted in a demountable cathode ray tube, emulsion side up on a face plate, in which the face plate was flat and the surface of the resist represented the focus of the electron beams emerging from the cathode ray gun. The cathode ray gun was programmed from a programming device which yielded a test pattern containing a collection of 10 micron lines and 10 micron diameter dots. The accelerating potential used was 10 kilovolts and the beam current was 5 microamperes. The spot diameter was 5 microns. Under these conditions, the available input bandwidth was approximately 1,500 megacycles and a writing speed of approximately $2,5 \times 10^6$ centimeters per second was detected, after processing and development. This processing involved heating at 170° C. in air, after removal of the resist specimen from the vacuum chamber of the demountable cathode ray tube assembly, for 30 seconds, after which the specimen was washed with deionized water at 40 to 50 degrees C. for 10 seconds and then air dried. The specimen was etched for 30 seconds with the etchant defined for Example 68. The previously exposed resist was removed by washing the specimen in acetone and drying and the insulative character of the areas under the exposed resist was defined electrically by making suitable contact between the bare silicon which had been exposed by etching and the silicon dioxide layer which had been protected by the resist. Examination of the specimen under the microscope showed that the 10 micron resolution pattern had been duplicated completely.

EXAMPLE 74

POSITIVE WORKING MODE

| | |
|---|---|
| N-vinyl carbazole | 600 g |
| 1-1'-bis(p-dimethylaminophenyl)ethylene | 5 g |
| Hexachlorethane | 125 g |
| 2,6,di-tert butyl p-cresol | 25 g |
| 3-ethyl rhodanine | 40 g |
| HPC (Mol. Wt. 200,000) | 900 g |
| Methyl ethyl ketone | 11 liters |

The formula as given above and defined as Example 74 was coated on 7/10ths mil thick copper which had been previously heat laminated to a polyester base. Three separate sheets were prepared at a wet coating thickness of 3 mils. Each was then dried for 30 seconds at 90° C. These and subsequent photoprocessing operations were carried out under red light conditions.

A printed circuit test target as defined in Example 66 was prepared on the magenta variety of the system as defined in U.S. Pat. No. 3,533,792 utilizing an ultraviolet transmitting polyester base as the substrate. Using a clear quartz medium pressure mercury arc lamp and the magenta photomask as the material to be duplicated, a 5 second exposure was made onto a photoresist through a multiple layer interference filter. This filter is the Baird-Atomics No. 10-68-5 whose peak transmittance is at 3,100 A with a 100 A bandwidth. Since the percentage of transmittance is 5 percent the calibrated energy per unit of area reaching the photoresist was approximately 0.05 millijoules per square centimeter, under the exposure conditions. The specimen was then heated at 90° C. for 30 seconds. After this heating step, the specimen was then given a blanket exposure in an amount equivalent to 50 millijoules per square centimeter to the fluorescent black lights previously described and finally heated for 90 seconds at 170° C. After this heating, the specimen was washed in cold deionized water while rubbing the surface lightly with a cotton swab. The specimen was then spray etched as defined in Example 66, washed with water, and finally with acetone to remove the resist. A positive image was obtained which was a reversal of the image obtained in Example 66. This means that areas equivalent to the image areas in the magneta photomask were retained, whereas areas equivalent to the non-image areas in the photomask were washed off, this being the opposite sign to that available in Example 66.

The second resist coated copper specimen was exposed through the photomask without the use of the interference filter to the fluorescent black lights described previously to yield an amount of energy at the image plane equivalent to 1,000 millijoules per square centimeter. The specimen was then allowed to stand in the dark for 1 hour, after which it was given a blanket exposure of 100 millijoules per square centimeter to the same light source. The specimen was then heated for 30 seconds at 250° C. and, finally, water, solvent and etch processed as described in the previous paragraph. Again, a positive image was obtained.

15 grams of rubrene were added to the composition given above under Example 74, and again the resist was coated as before on the copper clad polyester base at a 3 mil wet thickness and processed prior to exposure as described previously. Exposure was made through the magenta photomask with a fluorescent black light (which exhibited a peak of emission between 3,500 and 3,700 A for a time sufficient to yield an amount of energy per unit area at the image plane of 5 millijoules per square centimeter. After this exposure, the specimen was treated for 30 seconds at 90° C. and thereafter was given a blanket exposure to light peaking at 5,000 A. This blanket exposure was accomplished through an interference filter whose peak transmittance was at 5,000 A with a bandwidth of 400 A. The blanket exposure was continued until 100 millijoules per square centimeter exposure was completed. The light source in this case was tungsten lamp. After this exposure was completed, the specimen was developed and fixed by heating for 40 seconds at 200° C. The specimen was then wet processed and etched as previously described and a positive rendition of the initial photomask was obtained.

EXAMPLE 75

N-vinyl phthalimide was substituted in equal parts by weight for the N-vinyl carbazole utilized in Example 12. The material was applied to the polyester base as described for Example 1 and processed in the manner as described for Example 1. The exposed photoresist showed a greenish-yellow color after developing and washing in the warm water as defined previously. The principal difference in exposure was that a vacuum frame was utilized for the exposure and the vacuum maintained for 30 seconds prior to exposure. The photographic speed when measured in the visible with the appropriate filter was 20 millijoules per square centimeter with a O-max. of 2:1 and 3 millijoules per square centimeter with a D-max. of approximately 3.0 when the sensitometry was measured at 3,660 A.

EXAMPLE 76

The same as Example 75, except that N-vinylimidazole was used as the replacement for the N-vinyl carbazole in Example 12, and again the exposure was made in a vacuum frame with a hold period of 30 seconds prior to exposure. The color was green-brown. The speed in the visible measured with the appropriate filter was approximately 10 millijoules per square centimeter, with a D-max. of 2.4 and the speed measured at 3,660 A was 1.5 millijoules with a D-max. of above 3.

EXAMPLE 77

The same as Example 12, except that half of the N-vinyl carbazole was replaced with acrylamide. An exposure of 500 millijoules to a stepwedge exhibiting a maximum density of 3.0 was required to yield a fully developed resist. The color of the developed resist was greenish-blue.

When this composition was exposed in a vacuum frame with a 30 second hold time an exposure of 200 millijoules per square centimeter was necessary for complete exposure of the stepwedge.

EXAMPLE 78

The same as Example 12, except all of the N-vinyl carbazole was replaced with an equivalent weight of acrylamide. (No. vacuum frame exposure). An exposure of 200 millijoules per square centimeter was required to yield the density of 3.0. The developed and fixed resist was light blue in color. The speed in the visible was 30 millijoules per square centimeter to achieve a density of 1.0 and the speed measured at 3,660 A was 15 millijoules per square centimeter to yield a density of 1.0.

EXAMPLE 79

| | |
|---|---|
| Acrylamide | 150 g |
| N,N'methylenebisacrylamide | 5 g |
| Benzoin | 1.5 g |
| 2,6 di-tert butyl-p-cresol | 50 g |
| Triphenylstibine | 10 g |
| 3-ethyl rhodanine | 50 g |
| Iodoform | 100 g |
| 1-1'-bis-(-p-dimethylaminodiphenyl)ethylene | 10 g |
| HPC binder (Mol. Wt. 50,000) | 600 g |
| Solvent-benzene:methanol 1:1 | 7 liters |

The composition in accordance with Example 79 was laid down on the base described in Example 1. Exposure and processing was equivalent to that shown in Example 1. The developed out color of the resist after water washing was blue. When exposed in accordance with Example 1 (i.e., in a pressure frame and in the presence of oxygen or air) the photographic speed to yield a density of 1.0 was approximately 1/5th that defined for Example 1. However, when exposed in a vacuum frame with a hold period of 30 seconds, the photographic speed to yield a density of 1.0 was equivalent to that obtained in Example 1.

EXAMPLE 80

EDGE LIGHTED PANEL

A sheet of Plexiglass of optical grade (Rohm and Haas cast and polymerized methylmethacrylate) 18 inches by 18 inches by 0.25 inches was coated on one surface (18 inches × 18 inches) with a vacuum evaporated layer of aluminum metal to a thickness of 2 microns. The opposite side of the panel was then coated with a 3 mil thickness (wet) (under red light conditions) of the composition in accordance with Example 12 except that the solvent utilized was propanol instead of the mixture of methylene chloride and tetrahydrofuran utilized for Example 12 (See Example 1). After drying at 90° C. for 45 seconds, the uncoated edges of the panel were cleaned and polished by wiping with a sponge soaked in kerosene.

The side covered with photoresist was then given a 150 mj/cm$^2$ exposure to the flourescent black light source to a photomask containing alpha-numerical information. The Plexiglass plate was then placed on a flat support and heated for four minutes at 150° C. and allowed to cool. The developed photoresist was then washed with deionized water at 40° to 50° C. for removal of the non-image areas of the photoresist and then air dried.

The four 18 inch edges of the square plate were fitted with exteriorly light tight housings, each containing warm room light type 18 inch long fluorescent lamps so positioned with a slit fitting each edge of the panel so that the light from the lamps entered the panel at an angle of 30 degrees. The direct light coming from the fluorescent lamps could not be seen when viewed at normal incidence. However, the front face of the panel was easily visible at normal incidence in dim room light in all areas where the unexposed photoresist was removed in the water development step, thus yielding and inexpensive and useful edge lighted illumination system.

In a variation of the above procedure, the resist was applied, developed, and water washed as before. The clear, polished edges were then sealed with a water based casein glue. The panel was then immersed in stirred trichlorethylene for 5 minutes. The aluminum covered back, the glue covered edges, and the exposed and developed photoresist were unaffected by this treatment, but the exposed Plexiglass areas not covered by resist were etched to a depth of approximately 3 mils. The depressions produced by this etching were somewhat rounded in contour. After drying, the thus developed photoresist was then spray washed with kerosene which polished the etched depressions in the face of the Plexiglass panel, but did not affect any of the other surfaces of the panel including the developed and fixed photoresist. After the kerosene was dried off, the casein glue on the edges of the panel was removed by a wiping with water wetted sponge so as to reveal the clear, polished edges.

A panel thus prepared was edge lighted as before and the etched out indicia showed up much more brilliantly than the case where such indicia were not etched out.

We claim:

1. The process of forming a negative image which comprises:

coating a substrate with a solution of a light sensitive and electron beam sensitive composition consisting essentially of:

a. an ethylenically unsaturated N-vinyl monomer;

b. at least one organic compound which produces free radicals when exposed to a suitable dose of radiation; and c. hydroxy propyl cellulose with a molecular weight from about 25,000 up to about 1,000,000 in which constituents (a) and (b) are uniformly distributed;

drying the coating on said substrate;

exposing the coating imagewise to radiant energy;

thereafter heating the exposed coating to a temperature in the range between about 150°C and 250°C;

and then removing the unexposed portions of the coating from said substrate by washing the coating with water at a temperature below about 50°C.

2. The process of claim 1 in which said drying step is effected by heating to a temperature below about 100°C.

3. The process of claim 1 in which the imagewise exposure is too an electron beam.

4. The process of claim 1 in which the exposure is to light in the wavelength range between 3,500 and 3,800 A.

5. The process of claim 1 including the step of removing oxygen from said coating prior to exposure thereof.

6. The process of forming a positive image which comprises:

coating a substrate with a solution of a light sensitive and electron beam sensitive composition consisting essentially of:

a. an ethylenically unsaturated N-vinyl monomer;

b. at least one organic compound which produces free radicals when exposed to a suitable dose of radiation; and c. a hydroxy propyl cellulose with a molecular weight from about 25,000 up to about 1,000,000 in which constituents (a) and (b) are uniformly distributed;

drying the coating on said substrate;

exposing the dried coating imagewise to radiation in a first wavelength range;

thereafter heating the exposed coating to a temperature less than about 110°C;

then exposing said coating to a blanket exposure of radiation of a wavelength at least as long as the wavelength of the radiation used in the imagewise exposure;

and then removing the unexposed portions of said coating from said substrate by washing the same with water.

7. The process of claim 6 including the step of removing oxygen from said coating prior to exposure thereof.

* * * * *